United States Patent [19]

Kenney

[11] Patent Number: 4,648,073
[45] Date of Patent: Mar. 3, 1987

[54] SEQUENTIAL SHARED ACCESS LINES MEMORY CELLS

[75] Inventor: Donald M. Kenney, Shelburne, Vt.

[73] Assignee: International Business Machines Corporation, Armonk, N.Y.

[21] Appl. No.: 687,795

[22] Filed: Dec. 31, 1984

[51] Int. Cl.[4] .............................................. G11C 11/24
[52] U.S. Cl. ..................................... 365/149; 365/184
[58] Field of Search ................. 365/149, 184; 357/23.5

[56] References Cited

U.S. PATENT DOCUMENTS

| 3,387,286 | 6/1968 | Dennard | 340/173 |
|---|---|---|---|
| 3,979,734 | 9/1976 | Pricer et al. | 340/173 |
| 4,040,016 | 8/1977 | Lee et al. | 340/173 |
| 4,040,017 | 8/1977 | Lee | 340/173 |
| 4,080,590 | 3/1978 | Pricer | 365/149 |
| 4,086,662 | 4/1978 | Itoh | 365/189 |
| 4,168,538 | 9/1979 | Meusburger | 365/149 |
| 4,380,804 | 4/1983 | Lockwood et al. | 365/184 |
| 4,413,329 | 11/1983 | Thoma | 365/189 |
| 4,574,365 | 3/1986 | Scheuerlein | 365/149 |
| 4,586,163 | 4/1986 | Koike | 365/184 |

OTHER PUBLICATIONS

L. Arzubi et al, IBM Technical Disclosure Bulletin, vol. 23, No. 6, Nov. 1980, pp. 2331-2332, "One-Device Memory Cell Arrangement with Improved Sense Signals".

Primary Examiner—James W. Moffitt
Attorney, Agent, or Firm—Stephen J. Limanek

[57] ABSTRACT

A memory array is provided which includes a common sense line to which is connected first and second series of cells, each cell of each series includes a storage capacitor, a switching device and a bit line connected to a plate of the storage capacitor, with a common word line connected to the control electrode of each of the switching devices. The switching devices, preferably field effect transistors, of each series of cells have progressively higher threshold voltages beginning at the sense line, and the voltage applied to the common word line has a magnitude greater than that of the highest threshold voltage. Data is stored into or read from the storage capacitors by selecting the common word line and the bit line of the desired cell in a sequential manner.

19 Claims, 2 Drawing Figures

SEQUENTIAL SHARED ACCESS LINES MEMORY CELLS

DESCRIPTION

1. Technical Field

This invention relates to integrated semiconductor memory circuits and more particularly to very dense memory circuits which employ a capacitor for storing binary digits of information.

2. Background Art

Integrated semiconductor memory circuits, particularly those employing cells which include essentially a storage capacitor and a switch, have achieved high memory cell densities. One of the simplest circuits for providing small memory cells is described in commonly assigned U.S. Pat. No. 3,387,286, filed July 14, 1967, by R. H. Dennard. Each of these cells employs a storage capacitor and a field effect transistor acting as a switch to selectively connect the capacitor to a bit/sense line.

Commonly assigned U.S. Pat. No. 3,979,734, filed by W. D. Pricer and J. E. Selleck on June 16, 1975, describes a memory array made of small cells which employ storage capacitors and bipolar transistors. In this latter array, which is word organized, each storage capacitor of these cells has simply one capacitor terminal connected to a separate bit/sense line while selected cells forming a word are simultaneously accessed by utilizing a word pulse for coupling to the other terminal of the storage capacitors of that word.

In commonly assigned U.S. Pat. No. 4,080,590, filed by W. D. Pricer on Mar. 31, 1976, there is described a semiconductor memory produced in a unipolar technology which includes a cell having an inversion storage capacitor with one terminal connected to a bit/sense line, the other terminal being coupled to a source of charges by a pulse from a word line. To provide a word organized array of these cells, each word includes a source of charges disposed at the surface of a semiconductor substrate and a plurality of inversion capacitors disposed also at the surface of the semiconductor in spaced apart relationship from the charge source. Information is written into the capacitors by applying voltages of two different magnitudes, representing 1 and 0 bits of information, to one terminal of each of the capacitors while a word pulse produces inversion layers at the surface of the substrate between the capacitors to interconnect serially the charge source with each of the capacitors. The capacitors having the larger voltage store the greater amount of charge. This charge can then be detected by measuring the voltage across the storage capacitors when a word pulse again connects the charge source with each of the capacitors.

In yet another commonly assigned U.S. Pat. No. 4,040,017, filed by H. S. Lee on Mar. 31, 1976, there is disclosed a memory which is an improvement over the memory described in U.S. Pat. No. 4,080,590. In the improved memory, the source of charges is selectively pulsed to inject charge into the storage capacitors. The pulses of charge are timed so that they begin at least by the onset of the word pulse and terminate prior to the termination of the word pulse. Furthermore, prior to the termination of the word pulse, the voltage at the charge source is set to form a charge sink for draining excess charges. This charge flow technique may be referred to as a fill-spill operation.

In still another commonly assigned U.S. Pat. No. 4,040,016, filed by H. S. Lee and G. Vogl, Jr. on Mar. 31, 1976, there is disclosed a memory of the type described in above-identified H. S. Lee patent but wherein each cell of the memory has a pair of inversion capacitors with one plate of each capacitor being connected to one of a pair of bit/sense lines, the other plate of each capacitor being coupled to the source of charges when the word line is pulsed.

U.S. Pat. No. 4,086,662, filed by K. Itok on Aug. 11, 1976, describes a memory of the type disclosed in the above-identified Dennard patent but wherein a common sense amplifier is provided for a plurality of sense lines and a cell is located at each intersection of a word line and a sense line, with a control line connected to plates of the storage capacitors of the cells and a word line being used to read or write information from or to a given cell.

In commonly assigned U.S. Pat. No. 4,413,329, filed by E. P. Thoma on Sept. 16, 1982, there is disclosed a memory cell having a storage capacitor wherein a data sense-restore scheme is used in which a data sense line senses the state of charge in a selected cell and a data responsive circuit is used to rewrite low voltage signals through a separately accessed write device or transistor.

The IBM Technical Disclosure Bulletin article "One-device Memory Cell Arrangement with Improved Sense Signals," Vol. 23, No. 6, Nov. 1980, pp. 2331-2332, by L. Arzubi and W. D. Loeklein, teaches a memory array having cells each of which includes a storage capacitor and a transistor wherein the voltage applied to the plate side of the storage capacitor is dependent upon the state of the data sensed.

In commonly assigned U.S. patent application Ser. No. 485,808, filed on Apr. 18, 1983, now U.S. Pat. No. 4,574,365 by R. E. Scheuerlein, there is disclosed a memory array which includes a common sense line to which is connected a first storage capacitor through first switching means and a second storage capacitor through second switching means, with a common word line connected to the control electrodes of the first and second switching means, a first bit line connected to a plate of the first storage capacitor and a second bit line connected to a plate of the second storage capacitor. Data is stored into or read from the first storage capacitor by selecting the common word line and the first bit line and data is stored into or read from the second storage capacitor by selecting the common word line and the second bit line.

DISCLOSURE OF THE INVENTION

It is an object of this invention to provide an improved memory array including a plurality of series of cells, each of which has a very small area, utilizing a single storage capacitor and a single switch coupled to a single sense line having low capacitance per cell to provide a high signal transfer ratio and an increased sense line pitch.

In accordance with the teachings of this invention, a memory array is provided which includes a common sense line to which is connected first and second series of cells, each cell of each series includes a storage capacitor, switching means and a bit line connected to a plate of the storage capacitor, with a common word line connected to the control electrodes of each of the switching means. The switching means, preferably field effect transistors, of each series of cells have progressively higher threshold voltages beginning at the sense line, and the voltage applied to the common word line has a magnitude greater than that of the highest threshold voltage. Data is stored into or read from the storage capacitors by selecting the common word line and the bit line of the desired cell in a sequential manner.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1:
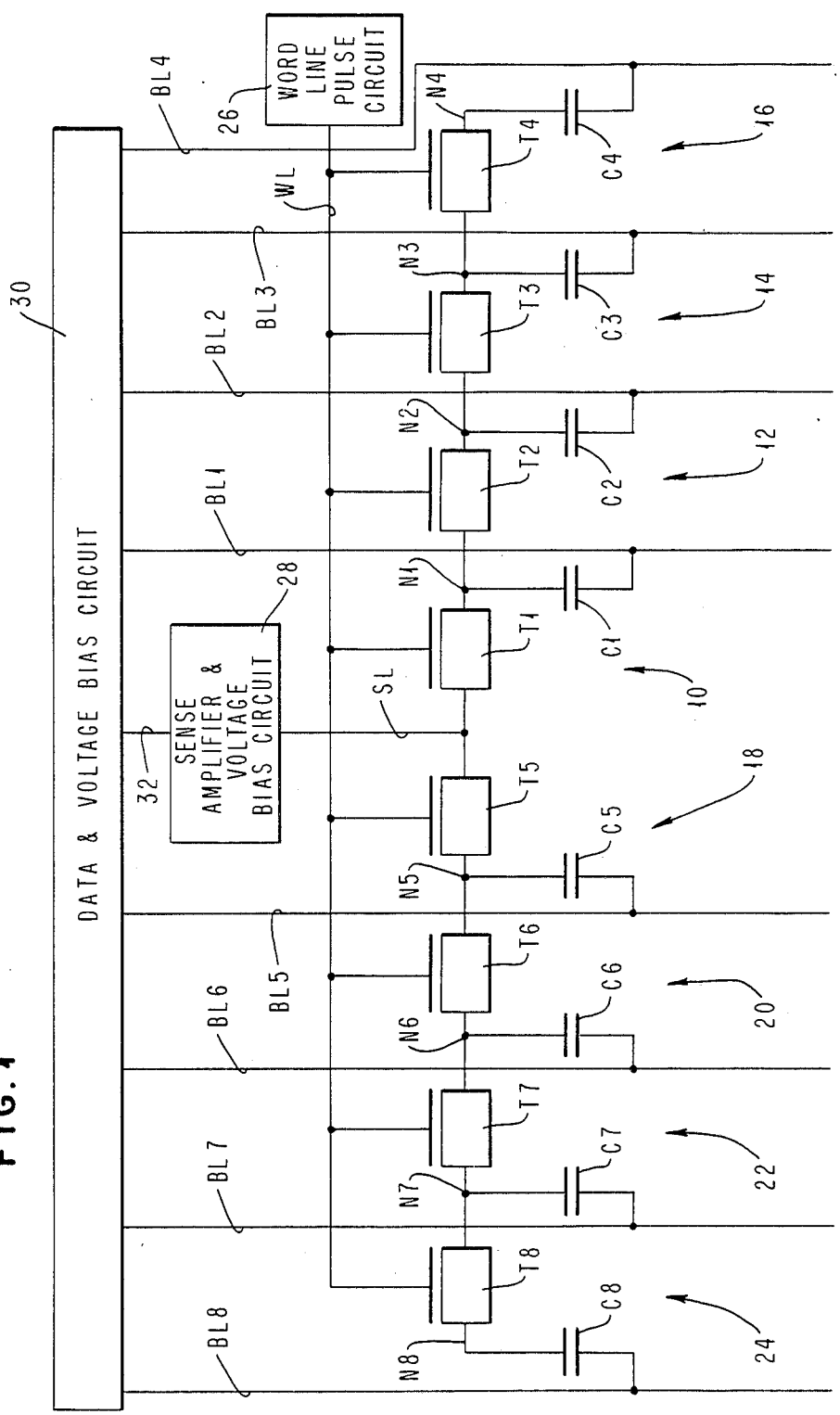
FIG. 1 illustrates a circuit of the present invention having eight cells each coupled to a common word line and to a common sense line.

Referring to the drawings in more detail, there is illustrated in FIG. 1 an embodiment of the circuit of the present invention which includes a first series of memory cells 10, 12, 14 and 16 arranged on the right side of a common sense line SL and a second series of memory cells 18, 20, 22 and 24 arranged on the left side of the sense line SL. Cell 10 of the first series of cells includes transistor T1, storage capacitor C1 connected at one plate to the transistor T1 at node N1 and a bit line BL1 connected to the other plate of storage capacitor C1. Cell 12 includes transistor T2, storage capacitor C2 connected at one plate to the transistor T2 at node N2 and a bit line BL2 connected to the other plate of the storage capacitor C2. Cell 14 includes transistor T3, storage capacitor C3 connected at one plate to the transistor T3 at node N3 and a bit line BL3 connected to the other plate of the storage capacitor C3. Cell 16, the last cell of the first series of cells, includes transistor T4, storage capacitor C4 connected at one plate to the transistor T4 at node N4 and a bit line BL4 connected to the other plate of the storage capacitor C4. Cell 18 of the second series of cells includes transistor T5, storage capacitor C5 connected at one plate to the transistor T5 at node N5 and a bit line BL5 connected to the other plate of capacitor C5. Cell 20 includes transistor T6, storage capacitor C6 connected at one plate to the transistor T6 at node N6 and a bit line BL6 connected to the other plate of capacitor C6. Cell 22 includes transistor T7, storage capacitor C7 connected at one plate to the transistor T7 at node N7 and a bit line BL7 connected to the other plate of capacitor C7. Cell 24, the last cell of the second series of cells, includes transistor T8, storage capacitor C8 connected at one plate to the transistor T8 at node N8 and a bit line BL8 connected to the other plate of capacitor C8. The transistors T1, T2, T3 and T4, preferably of the field effect transistor type, have threshold voltages of, e.g., 1.5, 2.0, 2.5 and 3.0 volts, respectively. The transistors T5, T6, T7 and T8, also preferably of the field effect transistor type, have threshold voltages of, e.g., 1.5, 2.0, 2.5 and 3.0 volts, respectively. In the first series of cells, transistor T1 is connected between the common sense line SL and node N1, transistor T2 is connected between node N1 and node N2, transistor T3 is connected between node N2 and node N3 and transistor T4 is connected between node N3 and node N4. In the second series of cells, transistor T5 is connected between the common sense line SL and node N5, transistor T6 is connected between node N5 and node N6, transistor T7 is connected between node N6 and node N7 and transistor T8 is connected between node N7 and node N8. A common word line WL is connected to the control or gate electrode of each of the transistors T1, T2, T3, T4, T5, T6, T7 and T8 and to a word line pulse circuit 26, of any conventional type. A sense amplifier and voltage bias circuit 28 is connected to the sense line SL and also to a data and voltage bias circuit 30 through a connecting line 32. The data and voltage bias circuit 30 is also connected to each of the bit lines BL1, BL2, BL3, BL4, BL5, BL6, BL7 and BL8. The voltage selectively applied by the circuits 26, 28 and 30 to the respective lines WL, SL and BL1, BL2, BL3, BL4, BL5, BL6, BL7 and BL8 is preferably $V_H$ equal to +5 volts.

Figure 2:
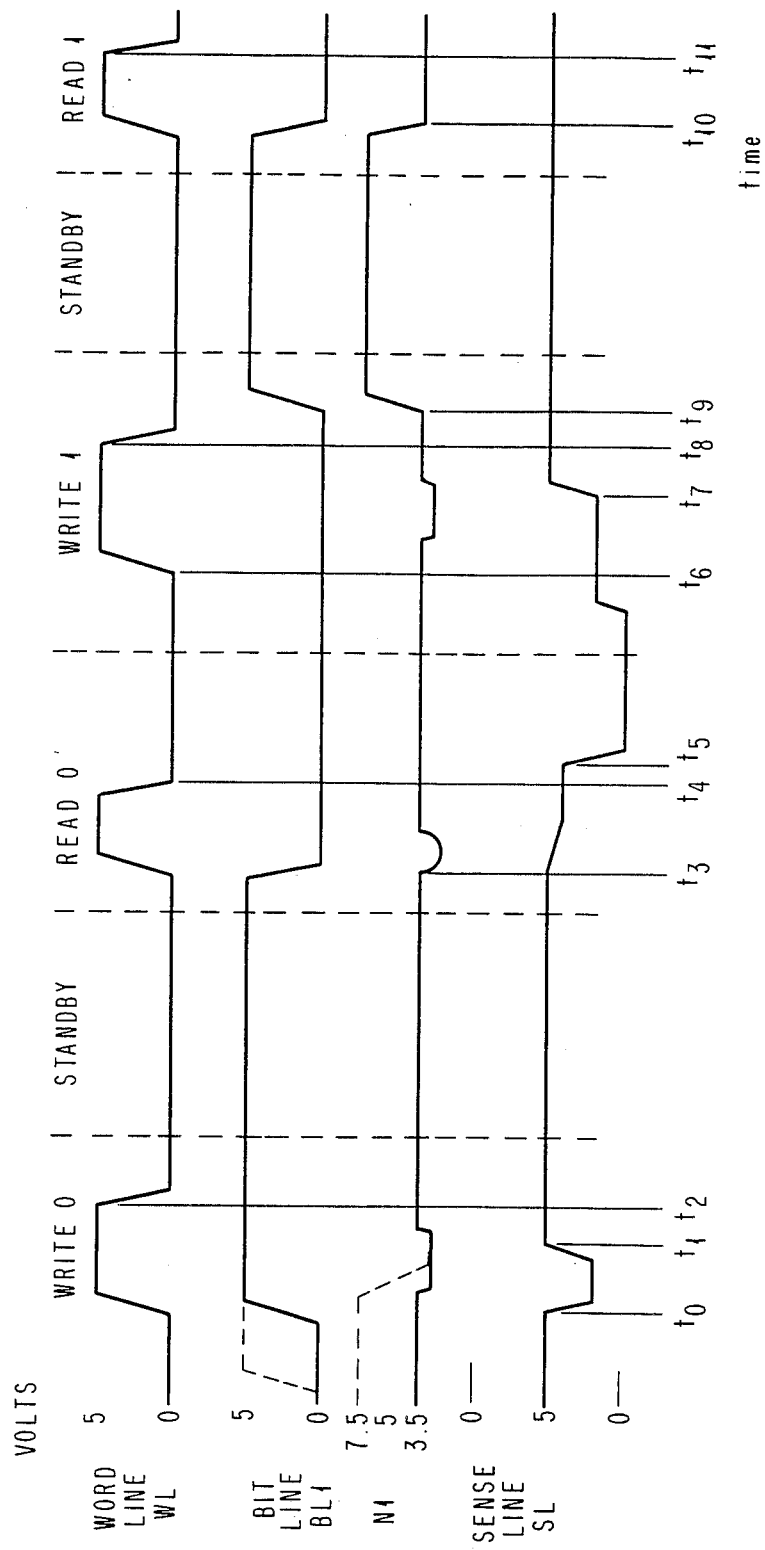
FIG. 2 is a pulse program which may be used to operate a cell of the circuit illustrated in FIG. 1.

To more clearly understand the operation of the circuit illustrated in FIG. 1, reference may be had to FIG. 2 of the drawing which shows a pulse program that may be used to operate one cell of the circuit of the present invention.

To write a 0 binary digit or bit of information into, e.g., cell 10 in FIG. 1, as indicated at time $t_0$ of FIG. 2, the voltage on the word line WL is increased to +5 volts to turn on transistor T1 and the voltage on the sense line SL is decreased from +5 volts to between zero and +3 volts, i.e., a decrease of at least one threshold voltage, $V_T$, e.g., 1.5 volts of transistor T1, causing the voltage on the first storage node N1 to adjust to a value somewhat below +3.5 volts, regardless of whether a 0 or 1 digit had been previously stored in node N1. At or prior to time $t_1$, the voltage on the first bit line BL1 is increased to +5 volts to write the 0 digit. At time $t_1$, the voltage on the sense line SL is returned to +5 volts driving the first storage node N1 to +3.5 volts, which is equal to the voltage $V_H$ minus the threshold voltage $V_T$. Charge is trapped on the first storage node N1 by turning off transistor T1 at time $t_2$. During standby, the voltage on the word line WL is maintained at zero volts, with the voltages on the bit line BL1 and the sense line SL being maintained at +5 volts and node N1 being at 3.5 volts.

To read the 0 digit stored in node N1, the voltage on the word line WL is increased to +5 volts and the voltage on the bit line BL1 is lowered to zero volts, as indicated at time $t_3$, causing the voltage at node N1 to decrease somewhat below +3.5 volts, turning on transistor T1 and, thus, discharging the sense line SL by a voltage $\Delta V$ which is equal to the voltage change on the bit line BL1, i.e., 5 volts, times the capacitance of the storage capacitor C1 divided by the capacitance of the sense line SL. The voltage on the word line WL is turned off at time $t_4$. When the voltage on sense line SL is applied to the sense amplifier circuit 28, which may be a conventional differential sense amplifier, the voltage drop $\Delta V$ on the sense line SL is sufficient to set the amplifier circuit 28, having a reference voltage of $\Delta V/2$ volts, so as to discharge the sense line SL to ground or zero volts at time $t_5$.

To write a 1 binary digit or bit of information into the cell 10, as indicated at time $t_6$, the voltage on word line WL is increased to +5 volts and the voltage on the sense line SL is again adjusted to between zero and +3 volts causing the voltage on node N1 to drop somewhat below 3.5 volts. At or before time $t_6$, the voltage on bit line BL1 is set to zero volts to write the 1 digit. At time $t_7$, the voltage on the sense line SL is increased to +5 volts, raising the voltage on the node N1 to +3.5 volts. The word line WL is set at zero volts at time $t_8$. When at time $t_9$ the voltage on the bit line BL1 is again increased to +5 volts, the voltage on the storage node N1 increases to somewhat less than approximately two times $V_H$ volts minus a threshold voltage $V_T$, or to about 7.5 volts, the differential being due to stray node N1 capacitance, other than the capacitance C1.

To read the 1 digit now stored in node N1, the voltage on the word line WL is increased to +5 volts and the voltage on the bit line BL1 is lowered to zero volts, as indicated at time $t_{10}$, causing the voltage at the node N1 to decrease or return to +3.5 volts. Since the voltage at the storage node N1 is not less than a threshold voltage below the voltage on the control gate of transistor T1, transistor T1 does not turn on and, therefore, the voltage on the sense line SL remains at +5 volts. Thus, the sense amplifier 28 will not be set to discharge the sense line SL. The transistor T1 is turned off at time $t_{11}$.

It should be noted that while the cell 10 is being written into or read out, the voltage on the bit lines BL2-BL8 is maintained at +5 volts. Accordingly, it can be seen that even though +5 volts is applied to the word line WL to turn on transistor T1 of the cell 10, the cell, e.g., 18, is not disturbed while reading cell 10 since the transistor T5 of the cell 18 is not turned on. The voltage stored on the sense node N5 of the cell 18 is at either +3.5 volts when storing a 0 digit or at approximately two times $V_H$ minus a threshold voltage $V_T$, or about +7.5 volts, when storing a 1 digit. Thus, when +5 volts is applied to the control gate of transistor T5, the voltage at the storage node N5 is not lower than the threshold voltage, 1.5 volts, below the control gate voltage of the transistor T5.

While writing information into cell 10 the sense line SL is set at between zero and three volts, which could disturb cell 18. Thus, the preferred operation of the cells is to read all cells before writing or restoring information into any cell, as will be explained in detail hereinbelow. The data sensed from a data node is stored into its respective bit line, e.g., data sensed by sense amplifier 28 from node N1 is fed through coupling line 32 into the data and voltage bias circuit 28 and stored in bit line BL1.

Information is written into cells 12, 14, 16, 18, 20, 22 and 24 in the same manner as the information was written into cell 10 and simultaneously therewith. More specifically, all eight cells are written simultaneously by applying +5 volts to the word line WL, lowering the voltage on the sense line to between 0 and 5 minus the largest $V_T$ volts and applying either 0 or +5 volts to each of the bit lines BL1-BL8 depending upon whether a 0 or 1 binary digit, respectively, is to be written into the particular cell. The voltage on the sense line SL is then raised to +5 volts, placing 5 minus $V_T$ volts on each node where $V_T$ is the respective cell transistor threshold voltage, and the word line WL voltage is reduced to zero volts. During standby, the voltage on all bit lines BL1-BL8 is raised to +5 volts. Thus, the voltage at each node N1-N8 is now either at $V_H$ minus a threshold voltage to represent a 0 digit or at $2V_H$ minus a threshold voltage to represent a 1 digit. It should be understood that since the transistors T1-T4 and also T5-T8 have different threshold voltages, the nodes N1-N4 and N5-N8 will have somewhat different voltages even though they all may be storing the same binary digit of information.

The information is read out of the eight cells 10-24 in a sequential manner. After the cell 10 is read out and its data stored in bit line BL1 as stated hereinabove, cell 12 is read out by applying +5 volts to the word line WL and dropping the bit line BL2 voltage to zero volts, while floating the sense line SL at +5 volts. If a 0 digit had been stored in node N2 of cell 12, the voltage at the sense line SL would have decreased and, after the return of the word line WL to zero volts, the sense amplifier 28 would decrease the voltage on sense line SL to zero volts. If, however, a 1 digit had been stored in node N2, the voltage at the sense line SL would have remained at +5 volts to indicate the stored 1 digit. The data from node N2 would then be stored in the bit line BL2 through connecting line 32 and data and voltage bias circuit 30. The cell 14 would then be read in the same manner, followed by a similar reading of cell 16. Cells 18, 20, 22 and 26 are then read out sequentially and their data from nodes N5, N6, N7 and N8, respectively, stored in the respective bit lines BL5, BL6, BL7 and BL8. After all eight cells have their data stored in their respective bit lines, the data is restored simultaneously into the respective nodes N1-N8 by applying +5 volts to the word line WL and lowering the voltage on the sense line SL to between 0 and 5 minus the largest $V_T$ volts. Thereafter, the sense line SL voltage is raised to +5 volts and subsequently the word line WL voltage is lowered to ground. Again, at standby all bit lines BL1-BL8 are raised to +5 volts.

It should be noted that the cell closest to the sense line SL, i.e., the cell with the transistor having the lowest threshold voltage, must be read out first and then the cells with transistors of higher threshold voltages are read out sequentially. It should be noted further that as long as data from cells located nearest to the sense line SL have been read out and stored in their respective bit lines, which is substantially isolated from all other cells, the other cells of the series of cells may be read out sequentially. It can be understood that the node N1 is coupled to the sense line SL through the transistor T1 and that node N2 is coupled to the sense line SL through transistors T1 and T2, with nodes N3 and N4 being coupled to the sense line SL through all intervening transistors in a similar manner. Also, nodes N5-N8 are similarly coupled to the sense line SL through transistors T5-T8. It should be understood further that when reading out, e.g., node N4, the voltage on each of the nodes N1, N2 and N3 is either at $V_H-V_T$ volts or $2V_H-V_T$ volts which would not tend to discharge the sense line SL. Consequently, the sense line SL would be discharged only if the voltage on node N4 was at minus a threshold voltage indicating the presence of a 0 digit stored in cell 16.

Although it was indicated hereinabove that the cells may be read out in the following order: cell 10, cell 12, cell 14, cell 16, cell 18, cell 20, cell 22 and cell 24, it should be understood that the cells may also be read out in a different order, namely: cell 10, cell 18, cell 12, cell 20, cell 14, cell 22, cell 16 and cell 24.

It should be noted that a novel memory has been disclosed wherein one sense line and one word line can be shared by many memory cells to provide improved cell density of one device type cells. By arranging a plurality of cells on both sides of a sense line, the number of cells is significantly increased within a given area of a chip or wafer. Thus, a shorter sense line is required per given number of cells to provide an improved signal transfer ratio between the storage capacitors and the sense line, and a sense amplifier pitch is provided which is much higher than the pitch available in known one device cell arrays, which is particularly important when fabricating a memory cell having a very small semiconductor substrate surface area.

It should also be noted that the memory array in accordance with teachings of this invention develops a lower voltage across the storage capacitor than that found in a conventional one device memory array, since the voltage across the storage capacitor is always less than 5 volts in the standby condition. In conventional one device memory arrays the capacitor reference plate is at 5 volts but the 0 digit is stored at zero volts producing a voltage difference of 5 volts across the storage capacitor. Due to this reduced voltage across the storage capacitor, it is possible to use thinner dielectric layers in the capacitor and, therefore, provide more storage capacitance in a given area. Furthermore, the present invention inherently provides a full 5 volt discharge of the storage capacitor during the read operation, i.e., when the bit line is changed from +5 volts to ground. In conventional one device memories, the capacitor discharge is limited to the word line voltage change less one threshold voltage, i.e., about 3.5 volts. Conventional one device memories require boosted word line circuitry to achieve a 5 volt discharge of the storage capacitor. Also, the array of the present invention may be used in known folded sense line and multiplexed sense amplifier arrangements.

It should be understood that although an array of cells has been illustrated in the interest of clarity which has only one word line and one sense line coupled to eight cells, the memory array of this invention may have hundreds of thousands of cells with one hundred or more word lines and one hundred or more sense lines, with each sense line having 4, 8, 16 or more cells coupled thereto. Also, additional cells along with another sense amplifier and voltage bias circuit 28 arranged as illustrated in FIG. 1 of the drawings may be connected to the word line WL and to the data and voltage bias circuit 30. The additional cells would be appropriately isolated from the cells 10-24 of FIG. 1, particularly when formed in a common semiconductor substrate.

While the invention has been particularly shown and described with reference to preferred embodiments thereof, it will be understood by those skilled in the art that various changes in form and details may be made therein without departing from the spirit and scope of the invention.

What is claimed is:

1. A memory comprising
   first and second cells, each of said cells including a transistor having a control electrode and a storage capacitor serially connected with said transistor, said transistors of said first and second cells being serially arranged and the transistor of said first cell having a lower threshold voltage than that of the transistor of said second cell,
   means for applying a control signal to the control electrodes of said transistors,
   first and second points of reference voltage, and
   a conductive line coupled through said first cell of said first point of reference voltage and through said second cell and the transistor of said first cell to said second point of reference voltage.

2. A memory as set forth in claim 1 wherein said transistors are field effect transistors.

3. A memory as set forth in claim 2 further including a sense amplifier connected to said conductive line.

4. A memory as set forth in claim 3 wherein said control signal applying means includes a word line having a voltage applied thereto having a magnitude greater than that of either of said threshold voltages.

5. A memory comprising
   first and second cells, each of said cells including a transistor having a control electrode and a storage capacitor serially connected with said transistor, said transistors of said first and second cells being serially arranged and the transistor of said first cell having a lower threshold voltage than that of the transistor of said second cell,
   means for applying a control signal to the control electrodes of said transistors, and
   a conductive line coupled through said first transistor to the storage capacitor of said first cell and through said second transistor to the storage capacitor of said second cell.

6. A memory as set forth in claim 5 wherein said transistors are field effect transistors.

7. A memory as set forth in claim 6 further including a sense amplifier connected to said conductive line.

8. A memory as set forth in claim 7 wherein said control signal applying a means includes a word line having voltage applied thereto having a magnitude greater than that of either of said threshold voltages.

9. A memory comprising
   a conductive line,
   first and second plurality of field effect transistors, said first plurality of field effect transistors being arranged serially and connected to said conductive line, said second plurality of field effect transistors being arranged serially and connected to said conductive line, the transistors of each of said plurality of field effect transistors having threshold voltages of different values, with the transistors more adjacent to said conductive line having progressively lower threshold voltages,
   a plurality of storage capacitors, a different one of said storage capacitors being connected to each of the transistors of said plurality of field effect transistors at an electrode remote from said conductive line, and
   means coupled to said conductive line to control electrodes of said transistors and to said storage capacitors for selectively charging and discharging said storage capacitors.

10. A memory as set forth in claim 9 further includes a sense amplifier and voltage bias circuit coupled to said conductive line.

11. A memory as set forth in claim 10 wherein said charging and discharging means further includes means for applying voltage pulses to said control electrodes and storage capacitors.

12. A memory comprising
    amplifying means,
    first and second serially arranged transistors coupled to said amplifying means,
    a word line connected to a control electrode of each of said transistors,
    a first storage capacitor connected at a first plate to a common point between said first and second transistors,
    a second storage capacitor connected at a first plate to said second transistor at its current carrying electrode remote from said amplifying means,
    a first bit line connected to a second plate of said first storage capacitor, a second bit line connected to a second plate of said second storage capacitor, first means for selectively applying pulses to said word line, and second means for selectively applying pulses to said first and second bit lines.

13. A memory as set forth in claim 12 wherein said amplifying means includes a voltage bias circuit.

14. A memory as set forth in claim 12 further including means for selectively applying data signals from said amplifying means to said first and second bit lines.

15. A memory as set forth in claim 12 wherein said first transistor has a lower threshold voltage than that of said second transistor.

16. A memory as set forth in claim 12 further including third and fourth serially arranged transistors coupled to said amplifying means, the control electrodes of said third and fourth transistors being connected to said word line, the first current carrying electrode of said third transistor being connected to said amplifying means, a third storage capacitor connected at one plate to the common point between said third and fourth transistor, a fourth storage capacitor connected at one plate to said fourth transistor at its current carrying electrode remote from said amplifying means, a third bit line connected to the other plate of said third storage capacitor, a fourth bit line connected to the other plate of said fourth storage capacitor, and wherein said second means further includes means for selectively applying pulses to said third and fourth bit lines.

17. A memory as set forth in claim 16 wherein said amplifying means includes a sense amplifier and voltage bias circuit.

18. A memory as set forth in claim 16 wherein said third transistor has a lower threshold voltage than that of said fourth transistor.

19. A memory as set forth in claim 17 wherein said second means further includes a data and voltage bias circuit and further including means for selectively coupling data from said amplifying means to said bit lines through said data and voltage bias circuit.

* * * * *